(12) United States Patent
Nakanishi et al.

(10) Patent No.: US 6,693,304 B2
(45) Date of Patent: Feb. 17, 2004

(54) LAMINATED LEAD FRAME, AND OPTICAL COMMUNICATION MODULE AND METHOD OF MANUFACTURING THE SAME

(75) Inventors: Hiromi Nakanishi, Osaka (JP); Yoshiki Kuhara, Osaka (JP); Takeshi Okada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/197,567

(22) Filed: Jul. 18, 2002

(65) Prior Publication Data

US 2003/0015718 A1 Jan. 23, 2003

(30) Foreign Application Priority Data

Jul. 18, 2001 (JP) .......................................... 2001-218765

(51) Int. Cl.[7] ............................................... H01L 27/15
(52) U.S. Cl. ............................. 257/81; 257/671; 438/27
(58) Field of Search ............................... 257/81, 82, 98, 257/99, 100, 666, 667, 671, 672; 438/25, 27, 64, 65, 107, 123, 124

(56) References Cited

U.S. PATENT DOCUMENTS 6,534,846 B1 * 3/2003 Takeuchi .................... 257/672

FOREIGN PATENT DOCUMENTS

| JP | 4-139868 | * 5/1992 | ................. 257/671 |
|----|----------|----------|--------------------------|
| JP | 10-154849 | 6/1998 | |

* cited by examiner

*Primary Examiner*—Mark V. Prenty
(74) *Attorney, Agent, or Firm*—Smith, Gambrell & Russell, LLP

(57) ABSTRACT

The optical communication module comprises a laminated lead frame composed of a plurality of lead frames that are laminated and held by a tie bar made of an insulating material, and an optical communication functional unit that is disposed on at least one layer of the lead frame. The optical communication functional unit comprises at least one of a light emitting element (LD) and a light receiving element and an optical transmission medium (optical fiber).

10 Claims, 13 Drawing Sheets

LAMINATED LEAD FRAME, AND OPTICAL COMMUNICATION MODULE AND METHOD OF MANUFACTURING THE SAME

BACKGROUND OF THE INVENTION

1. Field of the Invention

The present invention relates to a lead frame, and an optical communication module using the lead frame and a method for manufacturing the optical communication module.

2. Description of the Related Art

FIG. 10 is a cut-away perspective view showing a sectional structure of a semiconductor laser transmitter that is employed in related art. In a package, a semiconductor laser 10 (LD) and a monitor photodiode 15 (M-PD) for sensing its light intensity are disposed. A light signal output from the LD 10 is incident upon an optical fiber 61 via a lens 16. Such an optical communication module is called a coaxial type from such the structure.

However, the optical communication module of the coaxial type has a three-dimensional structure, and is limited in reducing the size and shortening the manufacturing process.

To solve this problem, a surface mounting technique for mounting the LD, the M-PD, the photodiode (PD) or a preamplifier (PRE-AMP) like a plane on the substrate has been developed. Referring to FIGS. 11 to 13, a manufacturing process of the optical communication module using this surface mounting technique will be described below. FIG. 11 is a plan view of the related-art lead frame, FIG. 12 is a flowchart showing a manufacturing process of the optical communication module, and FIG. 13 is an explanatory view for explaining a manufacturing method for the optical communication module.

A lead frame 120 is formed by plating Ni and Au plated successively on a copper plate having a thickness of 200 μm. The lead frame 120 comprises a frame 121 like a framework, a die pad 122 connected via a lead 123 to the frame 121, and each lead 123 connected to a tie bar 124, as shown in FIG. 11.

The optical communication module using the lead frame 120 is manufactured through the manufacturing process as shown in FIGS. 12 and 13.

First of all, a Si platform having a V-groove for fixing an optical fiber 61 inserted into a ferrule 62 and an electrode pattern for soldering a LD 10 or M-PD 15 is prepared.

The LD 10 and the M-PD 15 are soldered onto the Si platform 30, and then the optical fiber 61 is fixed to the Si platform 30 by the resin. An intermediate product in this state is called a sub-module. At fixing the optical fiber 61, the optical fiber 61 is sandwiched between a glass plate 130 and the Si platform 30.

The sub-module is fixed onto the die pad of the lead frame 120, wire bonded and sealed with a resin 140 by transfer molding technique.

Next, the tie bar 124 and the frame 121 of the lead frame 120 are cut, each lead 123 is electrically isolated, and the lead 123 exposed from the package is bent at a predetermined angle.

After the lead frame is completed up to this state, an electric current can be firstly passed through the LD and the M-PD. A so-called screening is made by passing electric current through the LD under high temperature environment or applying an inverse bias to the M-PD. The LD is determined good or defective, for embodiment, depending on a variation of threshold current that is especially sensitive to the stress. The M-PD is determined good or defective, depending on a change rate of leak current. The final check of product is made after screening.

In this way, the optical communication module using the surface mounting technique is enabled to lower the costs and reduce the size, and expected to contribute to a further progress of the optical communication.

However, the related-art technique had the following problems.

In the optical communication module using a standard one-layer lead frame, the number of leads is limited, so that the optical communication function to be implemented is limited. For example, in a case where the LD and the LD driver IC are built into the transmitter, the PD and the PRE-AMP are built into the receiver, or both of them are integrated, the number of components to be mounted is increased, requiring a greater number of leads.

SUMMARY OF THE INVENTION

Accordingly, it is an object of the present invention to provide a laminated lead frame capable of packaging at high density.

It is another object of the invention to provide an optical communication module of small size and low costs, which is allowed to package the optical communication functions at high density, and prevent the leakage of resin in resin molding.

Moreover, it is another object of the invention to provide a method for manufacturing an optical communication module capable of packaging the optical communication functions at high density.

A laminated lead frame of the present invention comprises a plurality of lead frames and a tie bar made of an insulating material for holding the plurality of lead frames like a laminate.

The laminated lead frame at high packaging density can be provided by integrating the plurality of lead frames that are laminated by the tie bar (insulating tie bar) made of insulating material. In particular, there is no shortage in the number of leads even if a number of components are mounted to implement the satisfactory optical communication functions.

Also, an optical communication module of the present invention comprises a laminated lead frame having a plurality of lead frames and a tie bar made of an insulating material for holding the plurality of lead frames like a laminate, and an optical communication functional unit that is disposed on at least one layer of the lead frame.

A great number of components can be mounted, employing the laminated lead frame, and the optical communication module can have the full optical communication functions.

In related art, since the tie bar was made of the same metal material as each lead, with each lead being electrically in conduction, the screening was not enabled by passing a current through the LD and the M-PD individually before resin molding. In the present invention, the tie bar is made of an insulating material, the leads in each layer are electrically isolated, whereby the screening is enabled at the former stage before packaging. Therefore, it is possible to eliminate the waste in rejection that causes the increased costs, and reduce the costs of the product.

Herein, the optical communication functional unit has the functions of a transmitter or receiver for use in the optical communication, or a composite transmitter/receiver. For instance, the optical communication functional unit preferably comprises at least one of a light emitting element and a light receiving element and an optical transmission medium. The optical transmitting module may employ the LD as the light emitting element and a driver IC for the LD as the electric circuit component. Furthermore, the optical transmitting module may employ the M-PD for sensing the light intensity of the LD. The optical receiving module may employ the PD as the receiving element and an amplifier for amplifying a PD signal as the electric circuit component. The optical transmitting/receiving module may comprise at least one pair of light emitting element and driver IC, and at least one pair of light receiving element and amplifier. The optical transmission medium may be the optical fiber or optical waveguide.

The material for the tie bar is not specifically limited so far as it has an insulating property and an excellent productivity. The thermoplastic resin that is cured in short time and excellent in productivity is preferable. In particular, the tie bar is preferably composed of the liquid crystal polymer.

The optical communication functional unit is preferably mounted on a Si substrate or a ceramic substrate. Si allows the V-groove to be easily formed by etching, or the ceramic such as alumina, which has insulating property and high hardness, can be worked at high precision.

The optical communication functional unit is desirably accommodated within a resin molded portion. The optical communication functional unit can be protected by resin molding. A specific method for forming the resin molded portion is preferably the transfer molding. The resin for use with the transfer molding may be epoxy resin, for example.

Moreover, a method for manufacturing an optical communication module according to the present invention comprises preparing a laminated lead frame having a plurality of lead frames and a tie bar made of an insulating material for holding the plurality of lead frames like a laminate, mounting an optical communication functional unit on at least one layer of the laminated lead frame, and resin molding the laminated lead frame with the optical communication functional unit mounted with a mold, wherein the tie bar prevents a leakage of a molding resin from the mold in the resin molding step.

In the resin molding step, usually, an object to be molded is placed within a mold, and the resin is injected. With the lead frame of laminated structure, it is difficult to prevent securely the leakage of resin especially from between each layer of the lead frame. With the method of the present invention, the excellent resin molded portion without burr caused by the leakage of resin can be produced by using the insulating tie bar for holding each layer of the lead frame like a laminate as a weir for preventing the leakage of resin in the molding step.

The insulating tie bar may be cut or left behind after the molding step. In the case where the insulating tie bar is left, it may be exposed outside the resin molded portion, or may be integrated with the molding resin to constitute a part of the outside shape of the resin molded portion.

DETAILED DESCRIPTION OF THE INVENTION

The present invention will be described below by way of embodiments.

[Embodiment 1]

Figure 1:
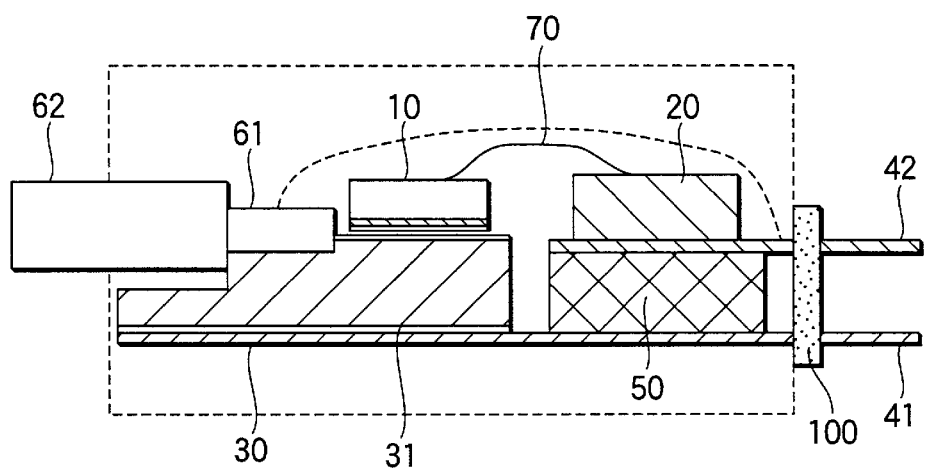
FIG. 1 is a longitudinal cross-sectional view of an optical transmitting module using a two-layer laminated lead frame.
Figure 2:
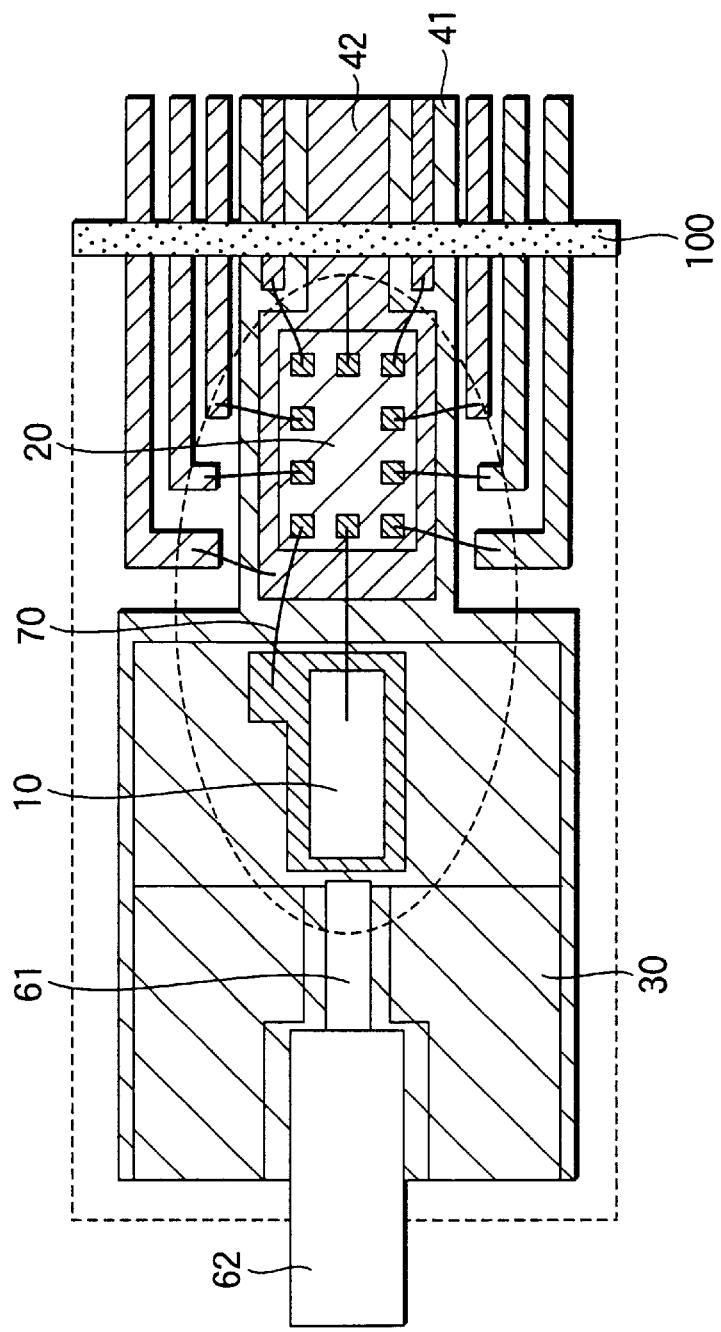
FIG. 2 is a plan view of the optical transmitting module as shown in FIG. 1.

FIG. 1 is a longitudinal cross-sectional view of an optical transmitting module using a two-layer laminated lead frame, and FIG. 2 is a plan view of the optical transmitting module as shown in FIG. 1.

The optical transmitting module comprises a semiconductor laser (LD) 10 as a light emitting diode, and a driver IC 20 for the LD 10 that is an electric circuit component. The LD 10 is supported via an Si bench 30 on a first lead frame 41, and the driver IC 20 is directly supported on a second lead frame 42 (second conductive medium) overlapped and laminated on a part of the first lead frame 41. An insulating spacer 50 (electrical insulator) is interposed between the first and second lead frames 41, 42, and leads are electrically isolated by an insulating tie bar 100. The insulating tie bar 100 may be a liquid crystal polymer or epoxy resin having a thickness of 0.3 to 0.6 mm, for example. A signal from the LD 10 is incident upon an optical fiber 61 inserted into a ferule 62.

The LD 10 may have an active layer composed of InGaAsP that is grown on InP, for example. The light emitting area of this LD 10 is narrow, and has a thickness of 0.2 to 0.4 $\mu$m and a width of 1 to 2 $\mu$m, for example. The optical fiber 61 is a single mode optical fiber having a core diameter of 10 $\mu$m, for example. To couple efficiently light emitted from the light emitting area of the LD 10 into the optical fiber 61 of small diameter, precise alignment is needed. Here, the V-grooves on the Si bench 30 produced by the photolithography technique and an LD alignment marker are employed. That is, the Si bench 30 has a shallow V-groove and a deep V-groove formed consecutively, in which the optical fiber 61 is fitted within the shallow V-groove and the optical fiber ferule 62 is fitted within the deep V-groove.

The driver IC 20 for the LD 10 is mounted on the second lead frame 42 separated in advance from the first lead frame 41 by the insulating spacer 50, and an Au wire 70 is led between the LD 10 and the driver IC 20 and between the driver IC 20 and each lead. Thereafter, the LD 10 and the driver IC 20 are covered with a silicon based potting resin to make the optical characteristics sable, and protect the LD 10, the driver IC 20 and the Au wire 70 from the stress at the time of transfer molding. The curved spaces encircled by the broken line in FIGS. 1 and 2 indicate the outer shape of potting.

Using a mold having a rectangular space as indicated by the broken line in FIGS. 1 and 2, the transfer mold is performed. Molding resin is an epoxy resin, for example. Here, the insulating tie bar 100 is positioned in contact with the rectangular space. If the resin is injected in this state, the insulating tie bar 100 is placed outside a resin molded portion, thereby completing the optical transmitting module. At the time of molding, the insulating tie bar 100 exists between the first and second lead frames 41 and 42 to play a role of a weir to prevent leakage of the resin securely. By preventing leakage of the resin, the resin molded portion without burr can be obtained. The insulating tie bar 100 may be finally cut away, or left behind.

In this manner, the lead frame consists of two layers, and the insulating tie bar 100 is employed, whereby a number of lead pins required to connect with the circuits at latter stage can be kept fully. Also, the spacing between the LD 10 and the driver IC 20 can be narrowed, so that the wiring impedance is reduced, enabling the high speed transmission at 1 Gbps or higher. Furthermore, since the insulating tie bar 100 is employed as the weir for preventing leakage of the resin at the time of transfer molding, the transfer molding can be excellently performed without leakage of the resin. In addition, since each lead is electrically isolated by the insulating tie bar 100, the electrical inspection or screening can be conducted before the transfer molding, whereby the failure is detected at the early time and the costs are reduced.

[Embodiment 2]

Figure 3:
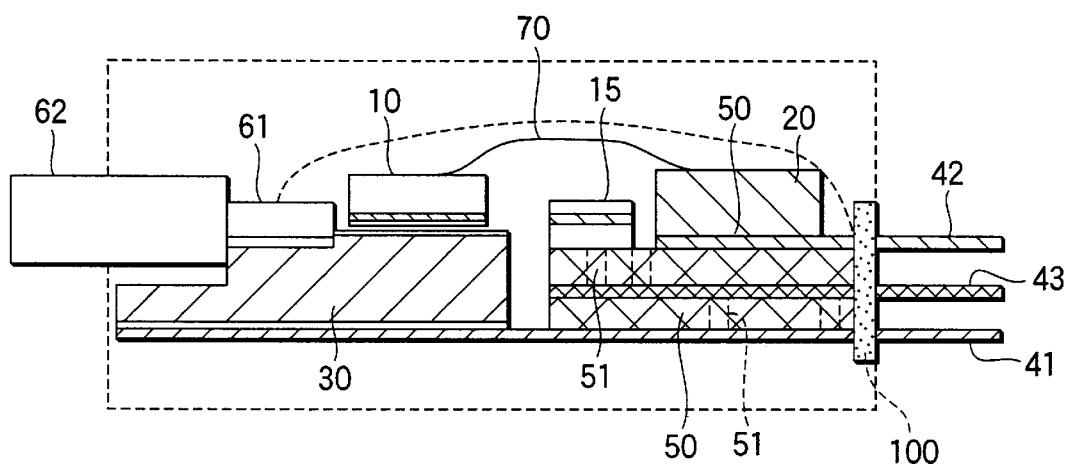
FIG. 3 is a longitudinal cross-sectional view of an optical transmitting module using a three-layer laminated lead frame.
Figure 4:
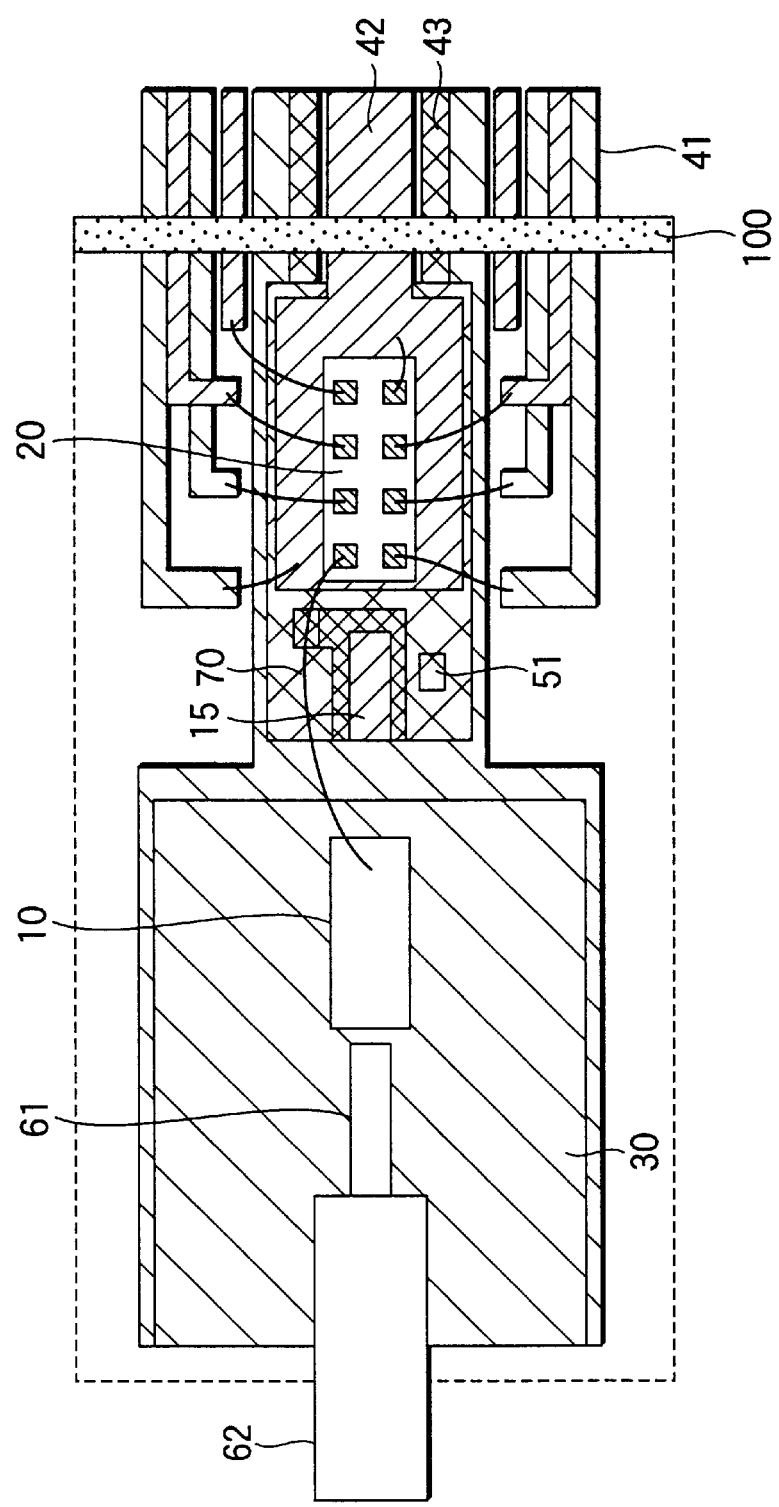
FIG. 4 is a plan view of the optical transmitting module as shown in FIG. 3.

The embodiment 2 employs a three-layer laminated lead frame, as shown in FIGS. 3 and 4. FIG. 3 is a longitudinal cross-sectional view of an optical transmitting module using the three-layer laminated lead frame, and FIG. 4 is a plan view of the optical transmitting module.

In this embodiment 2, a third lead frame 43 is disposed between the first and second lead frames 41 and 42, with an insulating spacer 50 interposed between each of the lead frames 41 to 43. The driver IC 20 is directly supported on the second lead frame 42.

The insulating tie bar 100 is formed like a wall to electrically isolate each of the first to third lead frames 41 to 43.

A first different point of this embodiment 2 from the embodiment 1 is that the lead frame consists of three layers, and an M-PD 15 for detecting the light intensity of the LD 10 is connected with a third lead frame 43 located intermediately. The M-PD 15 is disposed on the insulating spacer 50, and connected through an interlayer wiring 51 to the third lead frame 43. Each lead frame may be connected through the interlayer wiring, as needed. Of course, if the number of components is increased, the number of layers may be increased, or the shape of lead pin may be changed in various ways.

Moreover, a second different point is that the insulating tie bar 100 is integrated inside the resin molded portion. In the embodiment 1, the insulating tie bar protrudes out of the resin molded portion, but in the embodiment 2, the insulating tie bar 100 constitutes a part of an end face of the resin molded portion.

[Embodiment 3]

Figure 5:
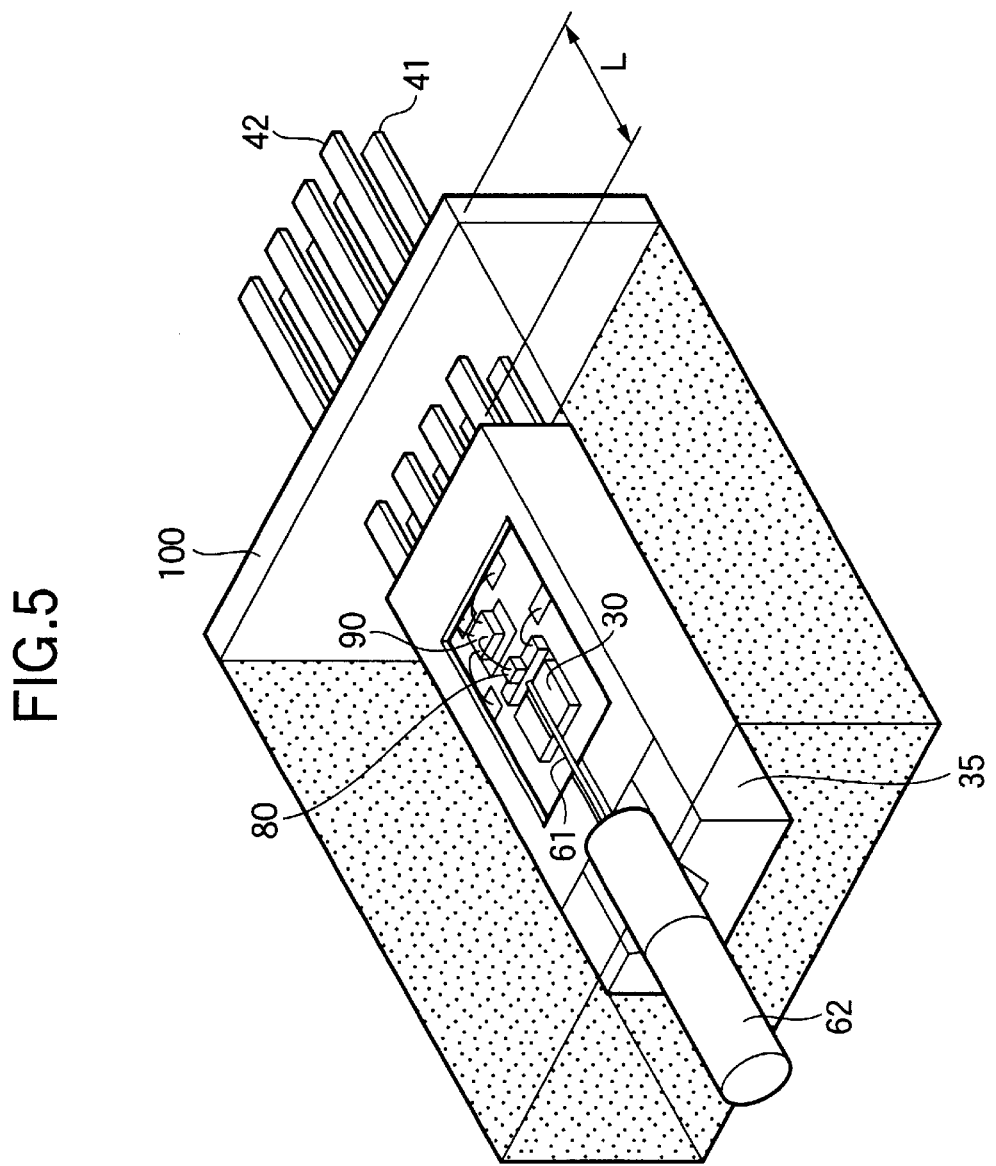
FIG. 5 is a schematic perspective view of an optical receiving module according to the invention.
Figure 6:
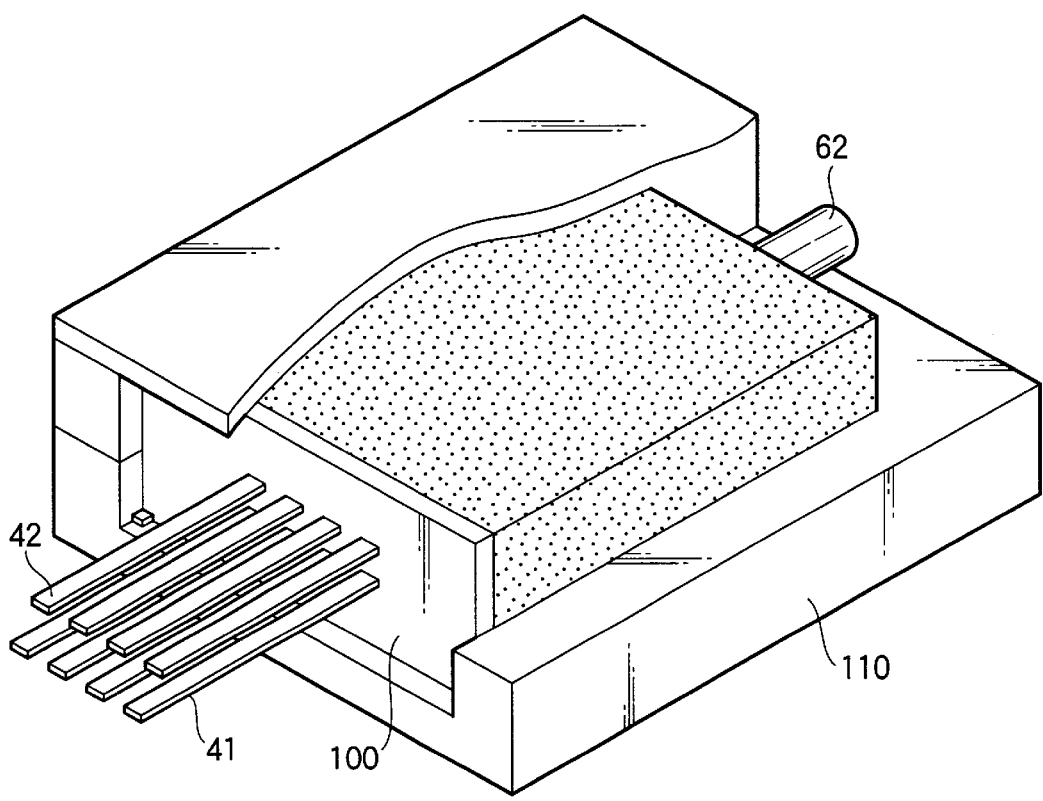
FIG. 6 is an explanatory view of a molding process in the optical receiving module as shown in FIG. 5.

FIG. 5 shows an optical receiving module. In the embodiment 3, a two-layer laminated lead frame has a liquid crystal base 35 and the insulating tie bar 100 which are insert molded beforehand. On the liquid crystal polymer base 35, the Si bench 30, the ferule 62, the optical fiber 61, alight receiving element (PD) 80, a preamplifier 90 (PRE-AMP) are mounted. The light receiving element may be a pin-PD having a light receiving layer of InGaAs, for example. The insulating tie bar 100 has an area corresponding to the end face of the resin molded portion, and becomes the end face of the resin molded portion after the end of the molding process. Then, the laminated lead frame having the components mounted is placed within a mold 110 as shown in FIG. 6 to perform the transfer molding. The mold 110 includes upper and lower mold parts and covers the five faces except for a face where the insulating tie bar 100 is formed.

In this case, though it seems that the insulating tie bar 100 is unnecessary, it is difficult to prevent leakage of the molding resin with the mold without producing any gap between layers of the two-layer lead frames 41 and 42. In this respect, if the insulating tie bar 100 closely contacted with the lead frame is employed as the weir for preventing leakage of the resin in the molding process, it is possible to prevent leakage of the resin.

The distance L between the insulating tie bar 100 and the liquid crystal polymer base 35 as shown in FIG. 5 is desirably as large as 1 mm to 3 mm. In a combination of the liquid polymer base 35 and the lead frame metal surface, there is possibly some moisture under severe environments of high temperature and high humidity. The distance L can form a portion which is covered with the molding resin such as epoxy resin that is familiar with the metal surface.

[Embodiment 4]

Figure 7:
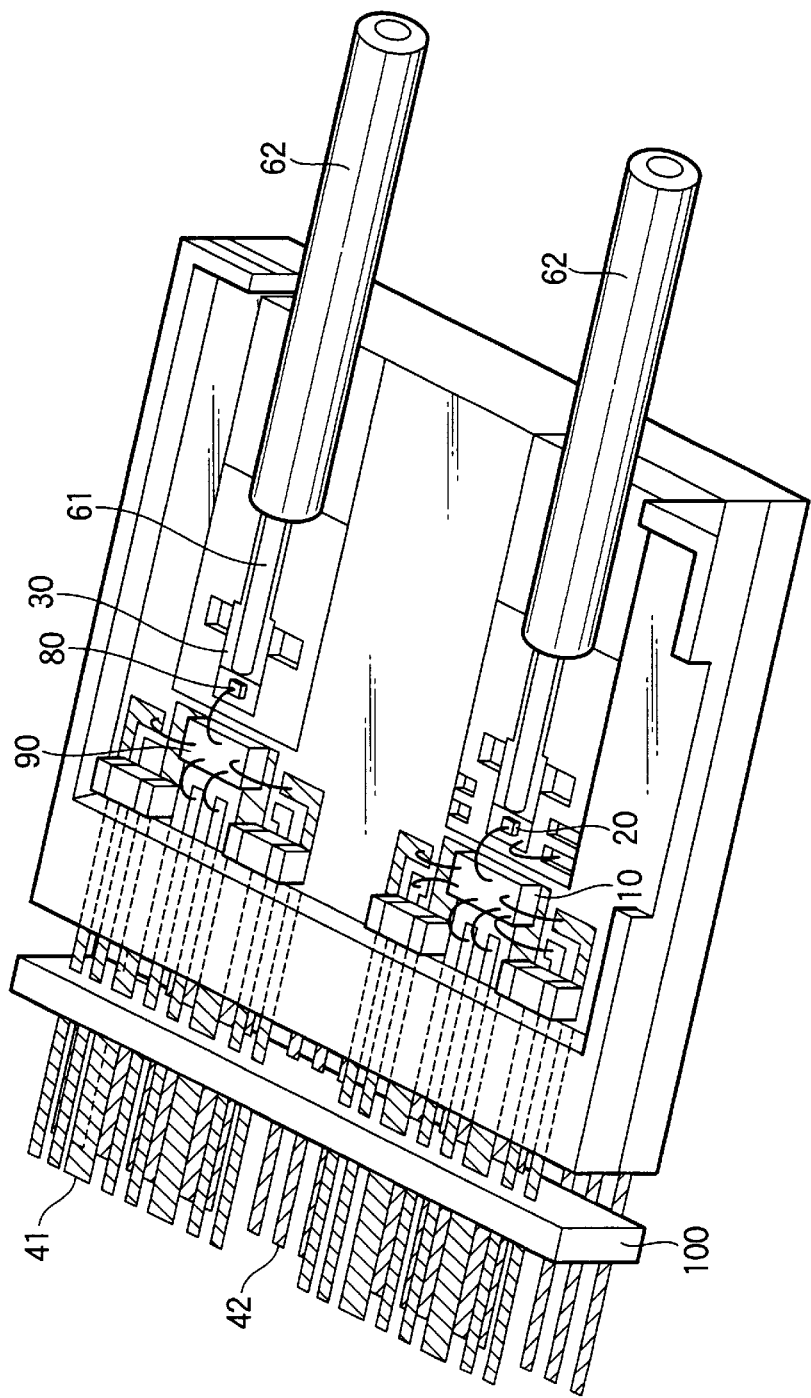
FIG. 7 is a schematic perspective view of an optical transmitting and receiving module according to the invention.

An optical transmitting and receiving module in which the transmitting function and the receiving function are integrally provided is illustrated in FIG. 7. FIG. 7 is a schematic perspective view showing an internal structure of the optical transmitting and receiving module. The transmitting and receiving module in this embodiment 4 has the basic structure that the transmitting module of the embodiment 1 as already described and the receiving module of the embodiment 3 are arranged in parallel and integrated on the liquid crystal polymer base 35.

The transmitting and receiving module of this invention employing the two-layer laminated lead frame can keep a sufficient number of leads, although it was very difficult in related art to constitute the transmitter and receiver of the one-layer lead frame, when many leads were required.

[Embodiment 5]

Figure 8A:
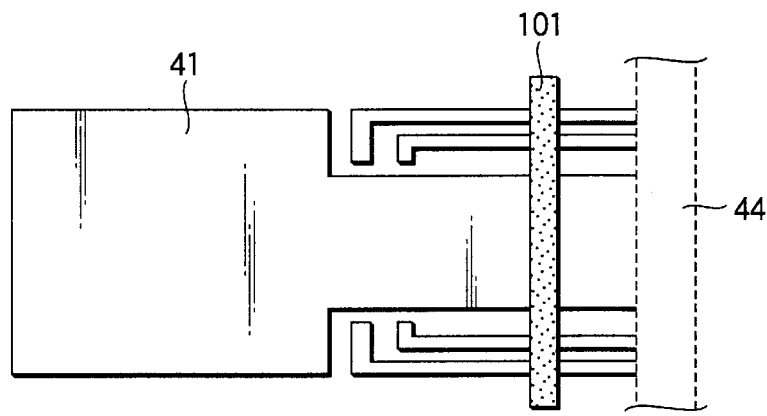
FIGS. 8a–8C are views showing a method for manufacturing a lead frame according to the present invention.
Figure 8B:
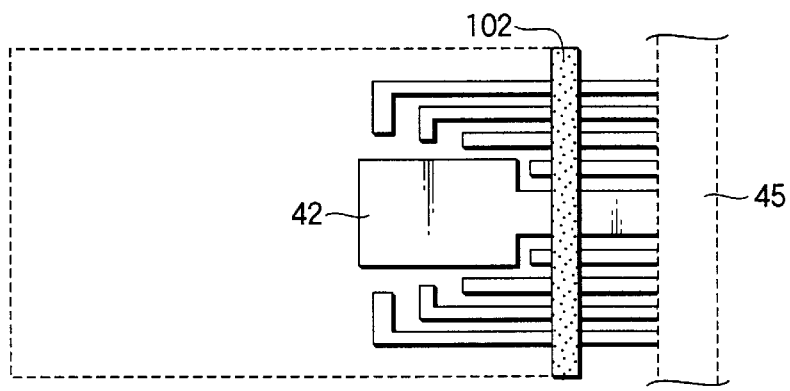
Figure 8C:
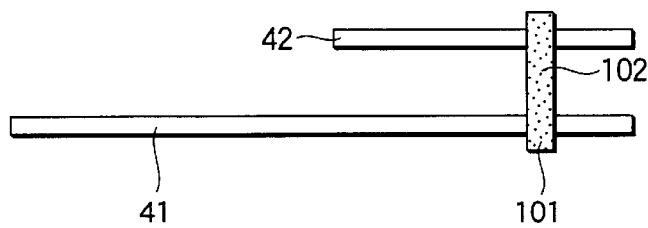

A manufacturing method of the laminated lead frame according to the present invention will be described below. Referring to FIG. 8, the manufacturing method of the two-layer lead frame is exemplified. FIG. 8A is a plan view of a first lead frame before forming an insulating tie bar, FIG. 8B is a plan view of a second lead frame before forming the insulating tie bar, and FIG. 8C is a longitudinal cross-sectional view of the first and second lead frames that are joined.

First of all, a first lead frame 41 in which each lead is connected by a metallic tie bar 44 is prepared, as shown in FIG. 8A. Then, an insulating tie bar 101 is formed on the first lead frame 41 of single layer, employing a mold. Likewise, a second lead frame 42 in which each lead is connected by a metallic tie bar 45 is prepared. Subsequently, an insulating tie bar 102 is formed on the second lead frame 42 of single layer, employing the mold. After forming the insulating tie bars 101 and 102, the metallic tie bars 44 and 45 for the first and second lead frames are cut and removed. Then, the insulating tie bars 101 and 102 in the two-layer lead frames are joined by adhesives.

[Embodiment 6]

Referring to FIG. 9, another manufacturing method of the laminated lead frame according to the invention will be described below.

In the embodiment 5, the insulating tie bars 101 and 102 are formed for each layer and joined, but the insulating tie bar 100 for connecting the two-layer lead frames may be formed at a time.

Figure 9A:
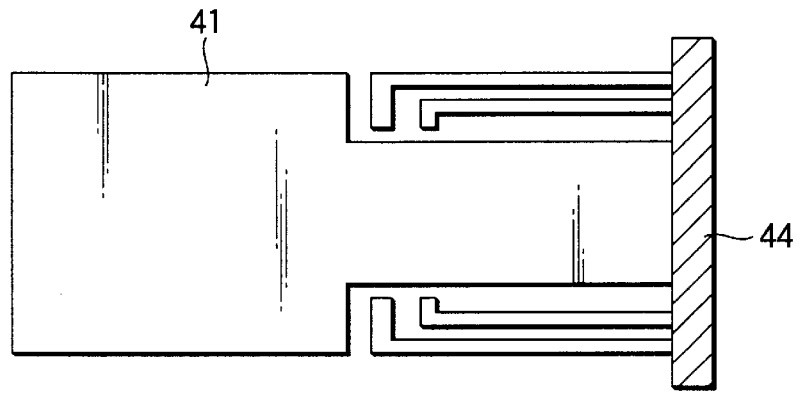
FIGS. 9A–9C are views showing another method for manufacturing a lead frame according to the present invention.
Figure 9B:
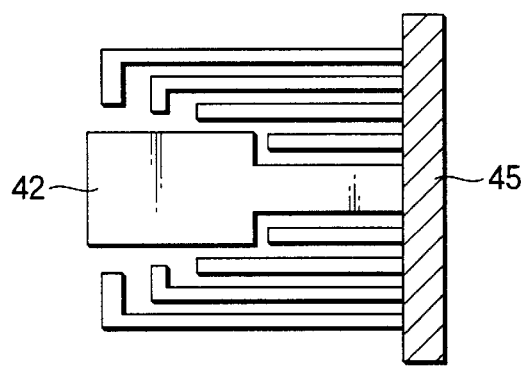
Figure 9C:
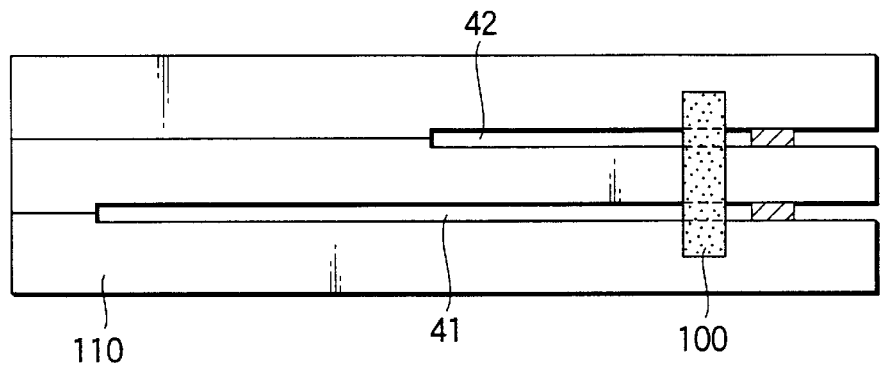
Figure 10:
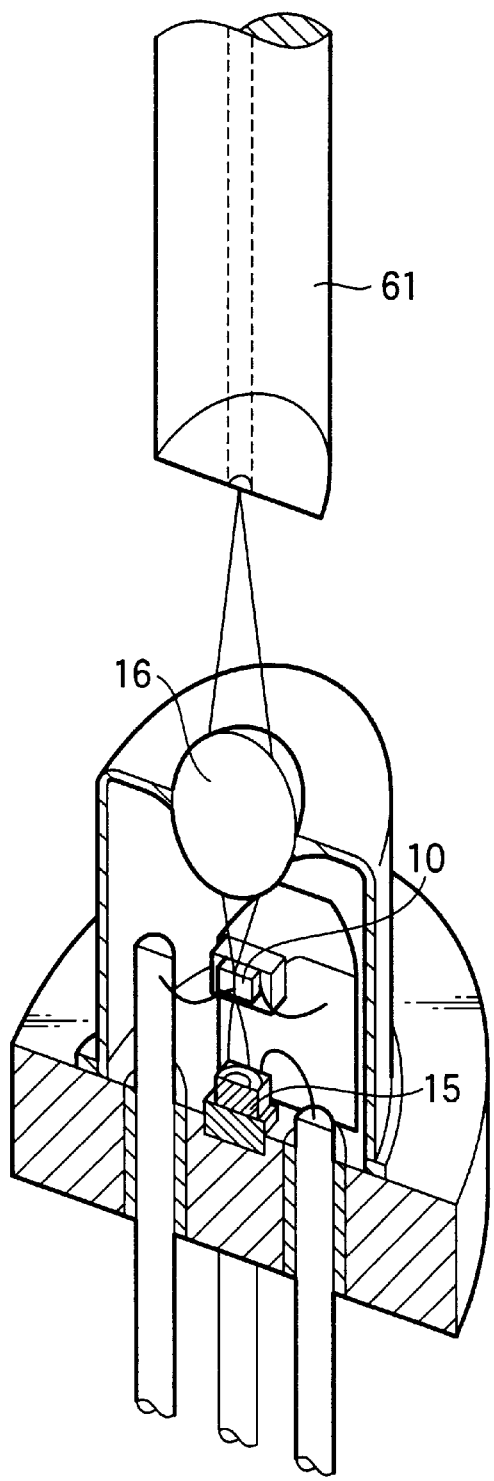
FIG. 10 is a cut-away perspective view showing a sectional structure of a related-art semiconductor laser transmitter.
Figure 11:
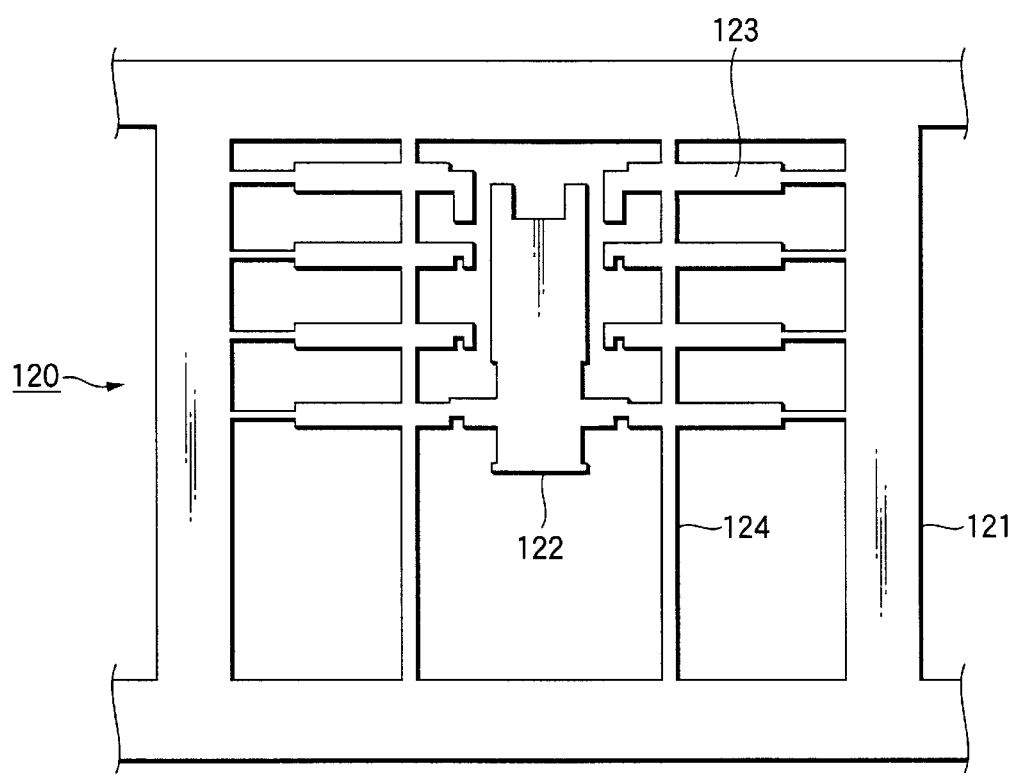
FIG. 11 is a plan view of a related-art lead frame.
Figure 12:
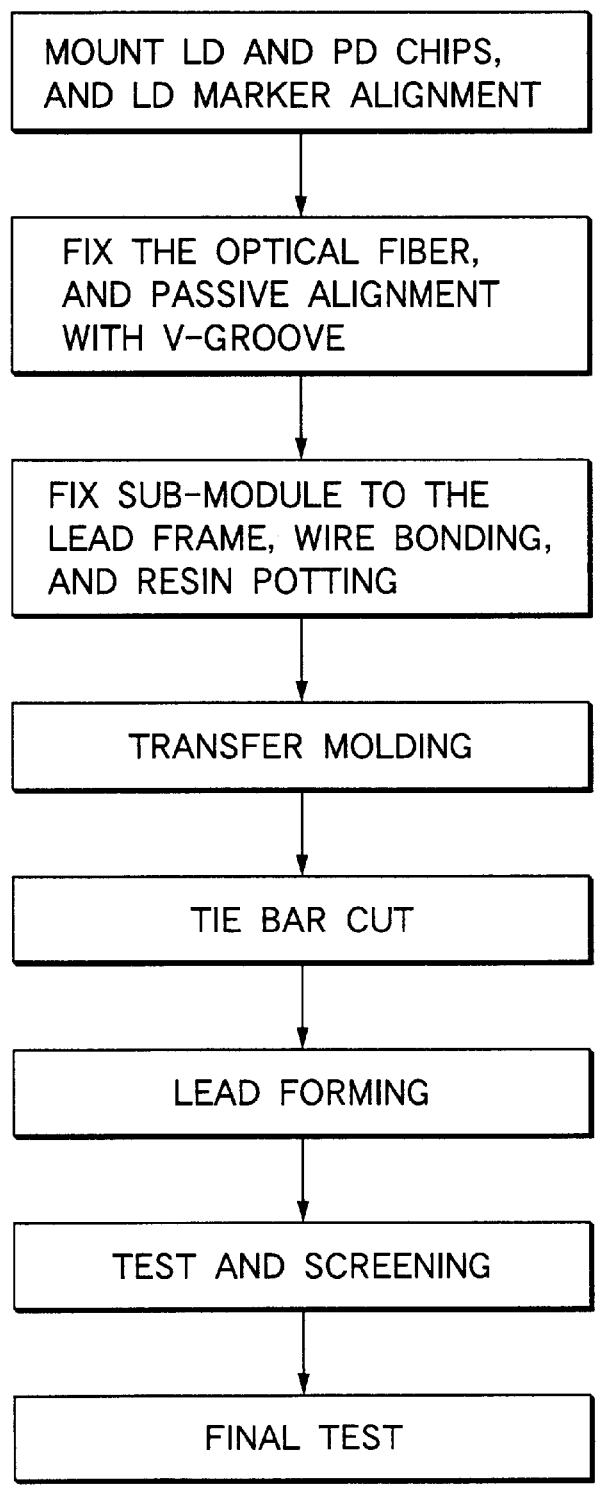
FIG. 12 is a flowchart showing a manufacturing process of an optical communication module.
Figure 13:
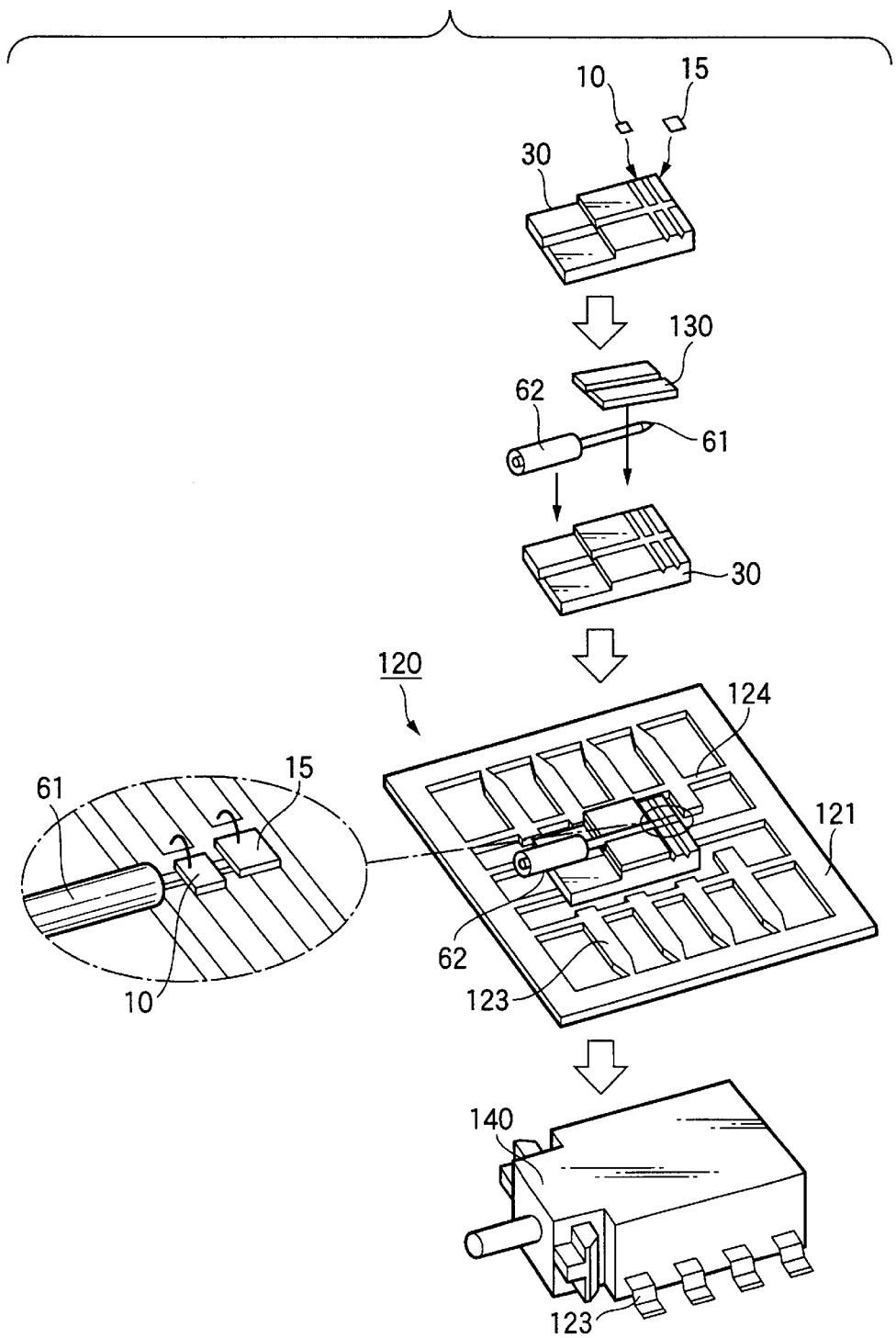
FIG. 13 is an explanatory view for explaining an optical communication module manufacturing method.

Like the embodiment 5, the first and second lead frames 41 and 42 in which each lead is connected by the metallic tie bars 44 and 45 is prepared (FIGS. 9A and 9B). These first and second lead frames 41 and 42 are sandwiched by a three divided mold 110, while the metallic tie bars 44 and 45 are left behind, as shown in FIG. 9C. The mold 110 is provided with a concave portion for forming the insulating tie bar to connect both the lead frames. The metallic tie bars 44 and 45 are cut and removed after the laminated lead frames are extracted from the mold 110, though it serves to prevent the resin from leaking at the molding. The manufacturing method of these lead frames is difficult to form the insulating tie bars after mounting various components on the lead frames as shown in FIG. 1, but is fully possible only with the lead frames.

As described above, the laminated lead frame of the present invention comprises the insulating tie bar, whereby the leakage of resin or production of burr that causes a lower yield at the time of resin molding can be reduced.

The optical communication module of the present invention employs the laminated lead frame to sufficiently keep a number of lead pins that are required for the high density packaging and the connection with the later stage circuits.

The optical communication module of the present invention allows for a narrower spacing between the LD and the driver IC, whereby the wiring impedance can be reduced, and the high speed transmission of 1 Gbps or higher is easily made.

The optical communication module of the present invention has the insulating tie bar to electrically isolate each lead, whereby the electrical test and the screening can be performed before resin molding, thereby detecting the failure rapidly and reducing the costs.

With the optical communication module and its manufacturing method according to the present invention, the insulating tie bar is employed as the weir for preventing the leakage of resin at the time of transfer molding, whereby the transfer molding is excellently made without leakage of the resin.

What is claimed is:

1. A laminated lead frame comprising:
    a plurality of lead frames; and
    a tie bar made of an insulating material for holding the plurality of lead frames like a laminate,
    wherein the tie bar is made of a liquid crystal polymer.

2. An optical communication module comprising:
    a laminated lead frame having a plurality of lead frames and a tie bar made of an insulating material for holding the plurality of lead frames like a laminate; and
    an optical communication functional unit that is disposed on at least one layer of said lead frame.

3. The optical communication module according to claim 2, wherein said optical communication functional unit comprises at least one of a light emitting element and a light receiving element, and an optical transmission medium.

4. The optical communication module according to claim 3, wherein said optical transmission medium is an optical fiber or an optical wavegiude.

5. The optical communication module according to claim 2, further comprising:
    a substrate for mounting said optical communication functional unit thereon,
    wherein the substrate is made of Si or a ceramic.

6. The optical communication module according to claim 2, further comprising:
    a resin molded portion for accommodating said optical communication functional unit therewithin.

7. The optical communication module according to claim 2, wherein the tie bar is made of a liquid crystal polymer.

8. The optical communication module according to claim 6, wherein the tie bar forms a part of an outside shape of the resin molded portion.

9. A method for manufacturing an optical communication module, comprising:
    preparing a laminated lead frame having a plurality of lead frames and a tic bar made of an insulating material for holding the plurality of lead frames like a laminate;
    mounting and optical communication functional unit on at least one layer of said laminated lead frame; and
    resin molding said laminated lead frame with said optical communication fuctional unit mounted with a mold,
    wherein the tie bar prevents a leakage of a molding resin from the mold in said resin molding step.

10. The method for manufacturing the optical communication module according to claim 9, wherein the tie bar forms a part of an outside shape of a resin molding portion in said resin molding step.

* * * * *